United States Patent [19]
Toyota et al.

[11] Patent Number: 5,963,064
[45] Date of Patent: Oct. 5, 1999

[54] LINEAR TRANSFER VOLTAGE TO CURRENT CIRCUIT

[75] Inventors: Kenji Toyota, Kodaira; Tatsuji Matsuura, Suginami-ku; Kenichi Hase, Fujisawa, all of Japan

[73] Assignee: Hitachi, Ltd., Tokyo, Japan

[21] Appl. No.: 09/008,424

[22] Filed: Jan. 16, 1998

[30] Foreign Application Priority Data

Jan. 17, 1997 [JP] Japan ................................. 9-006120

[51] Int. Cl.⁶ .................................................. H02M 11/00
[52] U.S. Cl. .......................... 327/103; 327/563; 327/67; 330/260
[58] Field of Search ................................ 327/103, 65, 66, 327/67, 563, 89; 330/253, 257, 260

[56] References Cited

U.S. PATENT DOCUMENTS

| | | | |
|---|---|---|---|
| 5,028,881 | 7/1991 | Jackson | 330/253 |
| 5,101,126 | 3/1992 | Butler et al. | 327/103 |
| 5,465,070 | 11/1995 | Koyama et al. | 327/350 |
| 5,608,352 | 3/1997 | Itakura | 330/253 |

OTHER PUBLICATIONS

Pai et al., "A 40–mW 55 Mb/s CMOS Equalizer for Use in Magnetic Storage Read Channels", IEEE Journal of Solid–State Circuits, vol. 29, No. 4, 1994, pp. 489–499.

Primary Examiner—Kenneth B. Wells
Assistant Examiner—Hai L. Nguyen
Attorney, Agent, or Firm—Antonelli, Terry, Stout & Kraus, LLP

[57] ABSTRACT

A differential circuit having a relatively simple structure capable of delivering a linear transfer characteristic and expanding an input dynamic range. An increase in magnitude of differential input voltage $V_{in}$ applied to each gate of differential-pair MOSFETs M1 and M2 in the differential circuit decreases control voltage $V_{CONT}$ in a control circuit. On the other hand, since a current fed to MOSFETs M3 and M4 in the differential circuit decreases simultaneously, a current supplied to the differential-pair MOSFETs M1 and M2 in the differential circuit increases. Thus, the present invention makes it possible to effectively expand the input dynamic range with respect to differential input voltage $V_{in}$.

3 Claims, 3 Drawing Sheets

LINEAR TRANSFER VOLTAGE TO CURRENT CIRCUIT

BACKGROUND OF THE INVENTION

The present invention relates to an electronic circuit including differential circuitry, and more particularly to a differential circuit comprising field-effect transistors.

In a conventional filter circuit incorporated in a hard disk read channel LSI device, mobile communication RF-band signal processing LSI device, etc., a conductance amplifier (Gm amplifier) has been employed for voltage-current conversion.

More specifically, instead of using a discrete element resistor R and capacitor C to provide a time constant of a filter circuit, an integrated filter circuit is configured with an integrated transconductance amplifier (Gm amplifier) and capacitor C so that compensation is made for variation in the integrated filter circuit by means of a master-slave-architecture compensation circuit, which is reported in IEEE JOURNAL OF SOLID-STATE CIRCUITS, VOL. 29, No. 4, APRIL 1994, pp. 489 to 499, for example.

A filter having desired characteristics can be implemented in an arrangement that a voltage-current conversion conductance of the Gm amplifier is made variable. That is, the Gm amplifier serves as a circuit which outputs a current in proportion to an input voltage and it can be used to configure a filter featuring lower-voltage, higher speed operation than that of a filter based on an operational amplifier (OP amplifier).

As contrasted with the Gm amplifier, the OP amplifier provides higher voltage gain (approx. 60 dB) and its negative-feedback virtual grounding is adopted in designing such a circuit as a filter. For ensuring stability in negative feedback, however, it is required to increase compensative capacitance, resulting in a disadvantage that a certain degree of limitation is imposed on frequency bandwidth.

Unlike the OP amplifier, the Gm amplifier is arranged to provide a constant transconductance without using virtual grounding, thereby eliminating the need for compensative capacitance. This feature of the Gm amplifier is advantageous in that a frequency band can be made wider than that of the OP amplifier. For attaining a high S/N ratio and low-distortion input/output characteristic, however, it is required to provide a constant transconductance (linear transfer characteristic) independent of a degree of input amplitude. Still more, it is desired to keep a transconductance constant in a wide frequency band.

Conventionally, the Gm amplifier for voltage-current conversion comprises a simple differential pair circuit, but an input range where a constant transconductance is attainable is not satisfactory in some applications.

Referring to FIG. 2, there is shown a conventional differential circuit arrangement for voltage-current conversion. A differential pair 201 comprises MOS field-effect transistors (MOSFETs) M1 and M2.

Each of the MOSFETs M1 and M2 operates in a saturation region. Denoting a differential input voltage as $V_{in}$, a transconductance parameter of MOSFETs M1 and M2 as K, a threshold voltage as $V_T$, gate-source voltages of M1 and M2 as $V_{GS1}$ and $V_{GS2}$, gate voltages of M1 and M2 as $V_1$ and $V_2$, drain currents of M1 and M2 as $I_1$ and $I_2$, a common-source voltage of M1 and M2 as $V_S$, and a common-source constant current of M1 and M2 as $2I_{SS}$, the following equations hold for them:

$$I_1 = K(V_{GS1} - V_T)^2 \tag{1}$$

$$I_2 = K(V_{GS2} - V_T)^2 \tag{2}$$

$$V_{GS1} - V_{GS2} = V_{in} \tag{3}$$

$$V_1 = V_{in}/2 \tag{4}$$

$$V_2 = -V_{in}/2 \tag{5}$$

$$V_{GS1} = V_1 - V_S = \frac{V_{in}}{2} - V_S \tag{6}$$

$$V_{GS2} = V_2 - V_S = -\frac{V_{in}}{2} - V_S \tag{7}$$

Substituting Equations 6 and 7 into Equations 1 and 2 yields $$I_1 + I_2 = K\left(\left(\frac{V_{in}}{2} - V_S - V_T\right)^2 + \left(-\frac{V_{in}}{2} - V_S - V_T\right)^2\right) \tag{8}$$

$$= K\left(\frac{V_{in}^2}{2} + 2(V_S + V_T)^2\right) = 2I_{SS}$$

Expanding Equation 8 gives $$\frac{2I_{SS}}{K} - \frac{V_{in}^2}{2} = 2(V_S + V_T)^2 \tag{9}$$

$$V_S = -V_T - \sqrt{\frac{I_{SS}}{K} - \frac{V_{in}^2}{4}}$$

Substituting Equation 9 into Equations 6 and 7 gives $$V_{GS1} = \frac{V_{in}}{2} + V_T + \sqrt{\frac{I_{SS}}{K} - \frac{V_{in}^2}{4}} \tag{10}$$

$$V_{GS2} = -\frac{V_{in}}{2} + V_T + \sqrt{\frac{I_{SS}}{K} - \frac{V_{in}^2}{4}} \tag{11}$$

Substitution of Equations 10 and 11 into Equations 1 and 2 yields $$I_1 = K\left(\frac{V_{in}}{2} + \sqrt{\frac{I_{SS}}{K} - \frac{V_{in}^2}{4}}\right)^2 \tag{12}$$

$$= I_{SS} + \sqrt{KI_{SS} - \frac{(KV_{in})^2}{4}} \cdot V_{in}$$

$$I_2 = K\left(-\frac{V_{in}}{2} + \sqrt{\frac{I_{SS}}{K} - \frac{V_{in}^2}{4}}\right)^2 \tag{13}$$

$$= I_{SS} - \sqrt{KI_{SS} - \frac{(KV_{in})^2}{4}} \cdot V_{in}$$

Denoting each of drain currents $I_3$ and $I_4$ of MOSFETs M3 and M4 connected with drains of differential-pair MOSFETs M1 and M2 as $I_{SS}$, output currents $I_{op}$ and $I_{on}$ of differential output terminals OUTP and OUTN are defined by the following equation.

$$I_{op} = I_4 - I_2 \tag{14}$$

$$= \sqrt{KI_{SS} - \frac{(KV_{in})^2}{4}} \cdot V_{in}$$

-continued $$I_{on} = I_3 = I_1 \tag{15}$$

$$= -\sqrt{KI_{SS} - \frac{(KV_{in})^2}{4}} \cdot V_{in}$$

From Equations 14 and 15, transconductance Gm of the Gm amplifier for voltage-current conversion is defined as expressed below.

$$|G_m| = \frac{d I_{op}}{d V_{in}} = -\frac{d I_{on}}{d V_{in}} \tag{16}$$

$$= \frac{KI_{SS} - \frac{(KV_{in})^2}{2}}{\sqrt{KI_{SS} - \frac{(KV_{in})^2}{4}}}$$

Circuit-simulated transfer characteristics of output currents $I_{op}$ and $I_{on}$ defined by Equations 14 and 15 are indicated by reference numerals 403 ($I_{op}$) and 404 ($I_{on}$) in FIG. 4. Also, transconductance Gm defined by Equation 16 is indicated by reference numerals 503 and 504 in FIG. 5.

As can be seen from FIGS. 4 and 5, within a range where differential input voltage $V_{in}$ has a small amplitude, there is provided a linear transfer characteristic that output currents $I_{op}$ and $I_{on}$ vary in proportion to differential input voltage $V_{in}$. However, when differential input voltage $V_{in}$ increases to a level corresponding to the vicinity of a saturation region of output current $I_{op}/I_{on}$, linearity is lost in the transfer characteristic. Thus, an increase in amplitude of input voltage $V_{in}$ decreases a value of transconductance Gm.

As mentioned above, the conventional differential circuit based on transconductance Gm of the Gm amplifier for voltage-current conversion has a disadvantage that its input dynamic range allowing a linear transfer characteristic is inadequate.

As a means for input dynamic range expansion, there is a known arrangement using a source degenerated Gm amplifier in which a resistor is provided at a source of differential-pair MOSFETs as shown in FIG. 3 (reported in IEEE JOURNAL OF SOLID-STATE CIRCUITS, VOL. 29, No. 4, APRIL 1994, pp. 489 to 499).

The Gm amplifier shown in FIG. 3 is arranged to expand the input dynamic range by dividing an input voltage with source resistor 301 (Rd). However, as the input dynamic range is expanded, a transconductance decreases accordingly, resulting in a problem that limitation is imposed on the filter frequency bandwidth. Still more, since parasitic zero point is involved in the Gm amplifier transfer characteristic due to parasitic capacitance 302 (Cp) and source resistor 301 (Rd), variation in transconductance occurs on a frequency region in the vicinity of the parasitic zero point. This zero point causes degradation in characteristics in a high-Q-factor filter circuit, and it is therefore required to make cancellation using a complex circuit called a master-slave compensation circuit in conventional arrangements.

SUMMARY OF THE INVENTION

It is therefore an object of the present invention to provide an electronic circuit including a differential circuit which has a relatively simple structure capable of expanding an input dynamic range where a linear transfer characteristic is attainable.

This object of the present invention is accomplished in one representative embodiment by providing an electronic circuit which is configured as described below. In the electronic circuit including a differential circuit (101) which comprises first and second field-effect transistors (M1, M2) having a differential input voltage ($V_{in}$) applied to each gate thereof and a common source connection therewith, said differential circuit (101) further comprises third and fourth field-effect transistors (M3, M4) which have a common source connection with each source of said first and second field-effect transistors (M1, M2). A drain of said first field-effect transistor (M1) and a drain of said third field-effect transistor (M3) are connected with one differential output (OUTN), and a drain of said second field-effect transistor (M2) and a drain of said fourth field-effect transistor (M4) are connected with the other differential output (OUTP). Further, said differential circuit (101) comprises a control circuit (102) having an output node (n3) for generating a control voltage ($V_{CONT}$) which decreases in response to an increase in magnitude of said differential input voltage ($V_{in}$) applied to each gate of said first and second field-effect transistors (M1, M2), wherein said control voltage ($V_{CONT}$) generated from said output node (n3) of said control circuit (102) is supplied to each gate of said third and fourth field-effect transistors (M3, M4) of said differential circuit (101). (Refer to FIG. 1.)

In the abovementioned circuit configuration, an increase in magnitude of said differential input voltage ($V_{in}$) decreases said control voltage ($V_{CONT}$) generated from the output node (n3) of said control circuit (102), thereby decreasing a current applied to said third and fourth field-effect transistors (M3, M4) of said differential circuit (101). Since a current fed to said first and second field-effect transistors (M1, M2) of said differential circuit (101) increases with a decrease in said current applied to said third and fourth field-effect transistors (M3, M4), it is possible to effectively expand an input dynamic range with respect to said differential input voltage ($V_{in}$) applied to said differential circuit (101).

BRIEF DESCRIPTION OF THE DRAWINGS

These above and further objects and features of the invention will be seen by reference to the description, taken in connection with the accompanying drawings.

DETAILED DESCRIPTION OF THE PREFERRED EMBODIMENTS

The present invention will now be described in further detail by way of example with reference to the accompanying drawings, particularly in connection with a preferred embodiment of an electronic circuit including a differential circuit according to the present invention.

Figure 1:
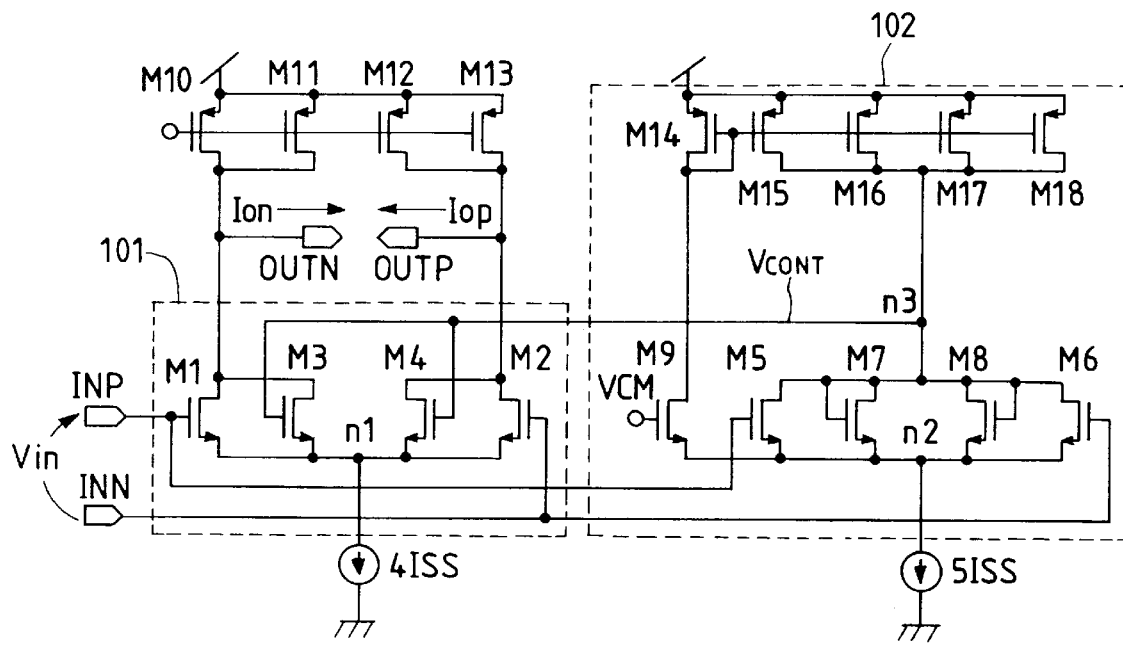
FIG. 1 is a circuit diagram showing a preferred embodiment of an electronic circuit including a differential circuit according to the present invention.
Figure 2:
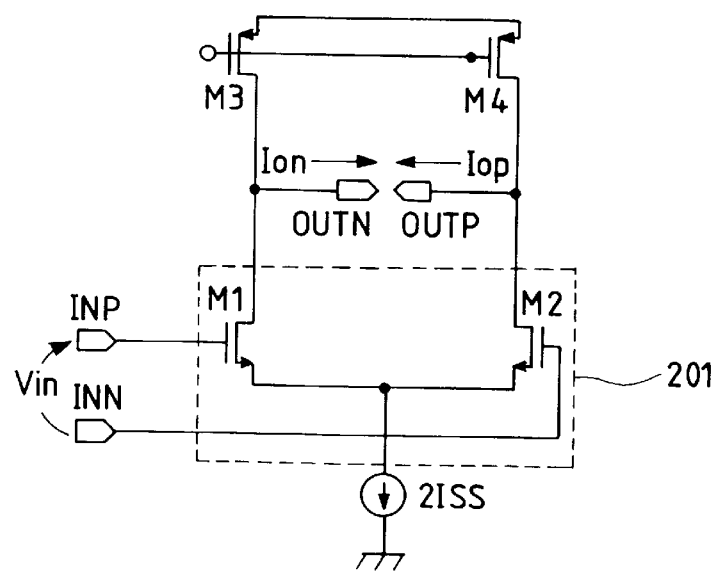
FIG. 2 is a diagram showing a conventional differential circuit.
Figure 3:
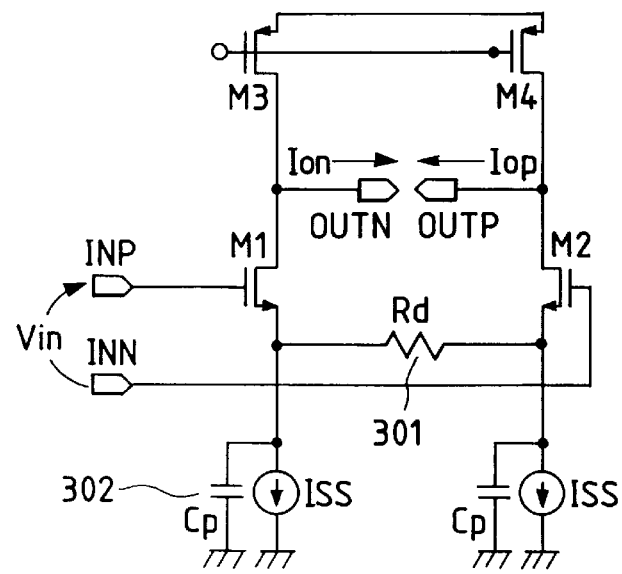
FIG. 3 is a diagram showing another conventional differential circuit.

Referring to FIG. 1, there is shown an electronic circuit for performing voltage-current conversion in the preferred embodiment of the present invention. A differential circuit 101 for performing voltage-current conversion on differential input voltage $V_{in}$ comprises MOSFETs M1, M2, M3 and M4, and a control circuit 102 for expanding an input dynamic range of the differential circuit 101 comprises MOSFETs M9, M5, M7, M8 and M6 which have a common source connection and MOSFETs M14, M15, M16, M17 and M18 which form a current mirror circuit.

Each of the MOSFETs M1, M2, M3 and M4 of the differential circuit 101 operates in a saturation region, and these MOSFETs M1, M2, M3 and M4 provide transconductance parameters K having approximately equal values and threshold voltages $V_T$ having approximately equal values. Here, current $4I_{SS}$ is used as a common-source constant current supplied to the MOSFETs M1, M2, M3 and M4. Differential input voltage $V_{in}$ to be supplied to the differential circuit 101 is applied to gates of the MOSFETs M1 and M2, and control voltage $V_{CONT}$ from an output node n3 of the control circuit 102 is applied to gates of the MOSFETs M3 and M4.

The MOSFETs M9, M5, M7, M8 and M6 of the control circuit 102 provide transconductance parameters K having approximately equal values and threshold voltages $V_T$ having approximately equal values. Here, current $5I_{SS}$ is used as a common-source constant current supplied to the MOSFETs M9, M5, M7, M8 and M6 via a node n2. Differential input voltage $V_{in}$ to be supplied to the differential circuit 101 is applied to gates of the MOSFETs M5 and M6, and intermediate voltage $V_{CM}$ of the differential input voltage $V_{in}$ is applied to a gate of the MOSFET M9. A short circuit is formed on a pair of gate and drain of each of the MOSFETs M7 and M8 serving as an impedance element, i.e., each of the MOSFETs M7 and M8 is arranged in diode connection.

In the control circuit 102, DC-level intermediate voltage $V_{CM}$ of differential input voltage $V_{in}$ is applied to the gate of the MOSFET M9. Through source-follower operation of the MOSFET M9, a potential at the node n2 of common source is made stable regardless of a magnitude of differential input voltage $V_{in}$.

More specifically, when differential input voltage $V_{in}$ has a magnitude of zero (no-input signal state), control voltage $V_{CONT}$ at the output node n3 of the control circuit 102 is balanced on DC-level intermediate voltage $V_{CM}$ of differential input voltage $V_{in}$. Consequently, each drain of the MOSFETs M1, M2, M3 and M4 of the differential circuit 101 draws current equal to $I_{SS}$, and each drain of the MOSFETs M9, M5, M7, M8 and M6 of the control circuit 102 also draws current equal to $I_{SS}$. Therefore, a potential at common-source node n1 of the differential circuit 101 and a potential at common-source node n2 of the control circuit 102 are expressed as follows:

$$V_{n1} = V_{n2} = V_{CM} - V_{GS} \qquad (17)$$
$$= V_{CM} - V_T - \sqrt{\frac{I_{SS}}{K}}$$

That is, the diode-connection-formed MOSFETs M7 and M8 of the control circuit 102 serve as level-shift elements which regulate control voltage $V_{CONT}$ at the output node n3 to a voltage level higher by gate-source voltage $V_{GS}$ according to a potential at the common-source node n2.

As a result, gate-source voltage $V_{GS9}$ of the MOSFET M9 with intermediate voltage $V_{CM}$ applied to its gate and gate-source voltage $V_{GS7}$ of the diode-connection-formed MOSFET M7 serving for level shifting are canceled out as expressed below, and therefore control voltage $V_{CONT}$ at the output node n3 is balanced on intermediate voltage $V_{CM}$.

$$V_{CONT} = V_{n2} + V_{GS7} \qquad (18)$$
$$= V_{CM} - V_{GS9} + V_{GS7}$$
$$= V_{CM} - V_T - \sqrt{\frac{I_{SS}}{K}} + V_T + \sqrt{\frac{I_{SS}}{K}}$$
$$= V_{CM}$$

If control voltage $V_{CONT}$ at the output node n3 increases beyond intermediate voltage $V_{CM}$ due to any cause, current at the diode-connection-formed MOSFETs M7 and M8 becomes higher than $I_{SS}$, decreasing current at the MOSFETs M9, M5 and M6 accordingly. Therefore, current at the MOSFETs M14, M15, M16, M17 and M18 of the current mirror circuit decreases to reduce control voltage $V_{CONT}$ at the output node n3 to intermediate voltage $V_{CM}$.

On the other hand, denoting the sum of drain currents at the MOSFETs M1 and M2 of the differential circuit 101 as $2I_{ds}$, drain currents $I_1$ and $I_2$ at the MOSFETs M1 and M2 of the differential circuit under condition that a magnitude of differential input voltage $V_{in}$ is not zero (active input signal state) are expressed as shown below similarly to Equations 12 and 13:

$$I_1 = I_{ds} + \sqrt{KI_{ds} - \frac{(KV_{in})^2}{4}} \cdot V_{in} \qquad (19)$$

$$I_2 = I_{ds} - \sqrt{KI_{ds} - \frac{(KV_{in})^2}{4}} \cdot V_{in} \qquad (20)$$

In this state, through source-follower operation of the MOSFET M9 in the control circuit 102, a potential at the common-source node n2 is almost stable. Therefore, as to the MOSFETs M5 and M6 which are supplied with differential input voltage $V_{in}$ similarly, drain currents $I_5$ and $I_6$ and the sum of them $I_5+I_6$ are expressed as shown below according to common-source MOSFET transfer characteristic instead of differential-pair MOSFET transfer characteristic:

$$I_5 = K(V_{GS5} - V_T)^2 \qquad (21)$$
$$I_6 = K(V_{GS6} - V_T)^2 \qquad (22)$$
$$V_{GS5} - V_{GS6} = V_{in} \qquad (23)$$
$$V_5 = V_{in}/2 \qquad (24)$$
$$V_6 = -V_{in}/2 \qquad (25)$$
$$I_5 = K\left(\frac{V_{in}}{2} - V_{n2} - V_T\right)^2 \qquad (26)$$
$$I_6 = K\left(-\frac{V_{in}}{2} - V_{n2} - V_T\right)^2 \qquad (27)$$
$$I_5 + I_6 = K\left(\frac{V_{in}^2}{2} + 2(V_{n2} + V_T)^2\right) \qquad (28)$$

On the other hand, in the control circuit 102, current $4I_{SS}$ is supplied by the MOSFETs M15, M16, M17 and M18 (output) of the current mirror circuit driven by drain current from the stabilized source-follower MOSFET M9.

Therefore, the sum of drain currents $I_7$ and $I_8$ at the diode-connection-formed MOSFETs M7 and M8 is found by:

$$I_7 + I_8 = 4I_{SS} - (I_5 + I_6) \qquad (29)$$

$$= 4I_{SS} - K\left(\frac{V_{in}^2}{2} + 2(V_{n2} + V_T)^2\right)$$

Since $I_7+I_8=2I_{SS}$ when differential input voltage $V_{in}$ is zero in the above expression, the following equation is given:

$$2K(V_{n2}+V_T)^2 = 2I_{SS} \qquad (30)$$

Substituting Equation 30 into Equation 29 yields $$I_7 + I_8 = 2I_{SS} - \frac{K}{2}V_{in}^2 \qquad (31)$$

Then, using Equations 28 and 31, the sum of drain currents $I_5$, $I_6$, $I_7$ and $I_8$ at the MOSFETs M5, M7, M8 and M6 of the control circuit 102 is obtained by:

$$I_5+I_6+I_7+I_8 = 2K(V_{n2}+V_T)^2 + 2I_{SS} \qquad (32)$$

Expanding Equation 32 gives $$4I_{SS} = 2K(V_{n2}+V_T)^2 + 2I_{SS} \qquad (33)$$

$$V_{n2} = -V_T - \sqrt{\frac{I_{SS}}{K}}$$

According to Equations 28, 31 and 32, as the sum of drain currents $I_5$ and $I_6$ at the MOSFETs M5 and M6 of the control circuit 102 increases in proportion with a magnitude of differential input voltage $V_{in}$, the sum of drain currents $I_7$ and $I_8$ at the diode-connection-formed MOSFETs M7 and M8 of the control circuit 102 decreases proportionally, so that the sum of drain currents $I_5$, $I_6$, $I_7$ and $I_8$ of the MOSFETs M5, M7, M8 and M6 of the control circuit 102 is made approximately constant almost irrespective of variation in magnitude of differential input voltage $V_{in}$. It is therefore obvious that a potential $V_{n2}$ at the common-source node n2 of the control circuit 102 is kept at an approximately constant level.

Equation 33 indicates that the potential $V_{n2}$ at the node n2 is constant (not variable), and a DC potential $V_{n2}$ at the node n2 is given by Equation 17.

According to Equation 31, with a decrease in the sum of drain currents $I_7$ and $I_8$ at the diode-connection-formed MOSFETs M7 and M8 serving as an impedance element in the control circuit 102, a voltage at the diode-connection-formed MOSFETs M7 and M8 decreases, i.e., a potential between the output node n3 and the common-source node n2 in the control circuit 102 decreases. This potential at the diode-connection-formed MOSFETs M7 and M8 is applied commonly to between the gate and source of MOSFETs M7 and M8 respectively as the gate-source voltage $V_{GS7}$, so that the drain currents $I_7$ of MOSFET M7 and $I_8$ of MOSFET M8 are equal together ($I_7=I_8$). Therefore, a half of the current expressed by the right side in Equation 31 is equal to the drain current $I_7$ at the diode-connection-formed MOSFET M7. Then, the following expression is obtained.

$$I_7 = K(V_{GS7} - V_T)^2 \qquad (34)$$

$$V_{GS7} = V_T + \sqrt{\frac{I_7}{K}}$$

$$= V_T + \sqrt{\frac{I_{SS}}{K} - \frac{V_{in}^2}{4}}$$

Since gate-source voltage $V_{GS7}$ at the diode-connection-formed MOSFET M7 serving as an impedance element in the control circuit 102 defined in Equation 34 is applied across the gate and source of each of the MOSFETs M3 and M4 in the differential circuit 101, drain currents $I_3$ and $I_4$ at the MOSFETs M3 and M4 are given by:

$$I_3 = I_4 = K(V_{GS7} - V_T)^2 \qquad (35)$$

$$= I_{SS} - \frac{K}{4}V_{in}^2$$

On the other hand, since the sum of drain currents $I_1$, $I_2$, $I_3$ and $I_4$ at the MOSFETs M1, M2, M3 and M4 is set as $4I_{SS}$ by the constant current supply of the common-source node n1 in the differential circuit 101, the following expression is obtained:

$$4I_{SS} = I_1 + I_2 + I_3 + I_4 \qquad (36)$$

$$= 2I_{ds} + 2I_{SS} - \frac{K}{2}V_{in}^2$$

$$I_{ds} = I_{SS} + \frac{K}{2}V_{in}^2$$

In the differential circuit 101, differential output. OUTN is connected with the drain of the MOSFET M1 and the drain of the MOSFET M3, and differential output OUTP is connected with the drain of the MOSFET M2 and the drain of the MOSFET M4.

Hence, using Equations 19, 35 and 36, the sum of drain current $I_1$ at the MOSFET M1 connected with differential output OUTN and drain current $I_3$ at the MOSFET M3 connected with differential output OUTN is expressed through rearrangement as follows:

$$I_1 + I_3 = 2I_{SS} + \sqrt{KI_{SS}} \cdot V_{in} \qquad (37)$$

Similarly, using Equations 20, 35 and 36, the sum of drain current $I_2$ at the MOSFET M2 connected with differential output OUTP and drain current $I_4$ at the MOSFET M4 connected with differential output OUTP is expressed through rearrangement as follows:

$$I_2 + I_4 = 2I_{SS} - \sqrt{KI_{SS}} \cdot V_{in} \qquad (38)$$

Denoting each drain current at the MOSFETs M10, M11, M12 and M13 connected with the drain of the differential-pair MOSFETs M1 and M2 in the differential circuit 101 as $I_{SS}$, output currents $I_{op}$ and $I_{on}$ at differential output terminals OUTP and OUTN are found by:

$$I_{op} = 2I_{SS} - (I_2 + I_4) \qquad (39)$$

$$= \sqrt{KI_{SS}} \cdot V_{in}$$

-continued $$I_{on} = 2I_{SS} - (I_1 + I_3) \quad (40)$$
$$= -\sqrt{KI_{SS}} \cdot V_{in}$$

From Equations 39 and 40, a value of transconductance Gm of the Gm amplifier for voltage-current conversion is determined as expressed below:

$$|G_m| = \frac{d I_{op}}{d V_{in}} = -\frac{d I_{on}}{d V_{in}} = \sqrt{KI_{SS}} \quad (41)$$

Figure 4:
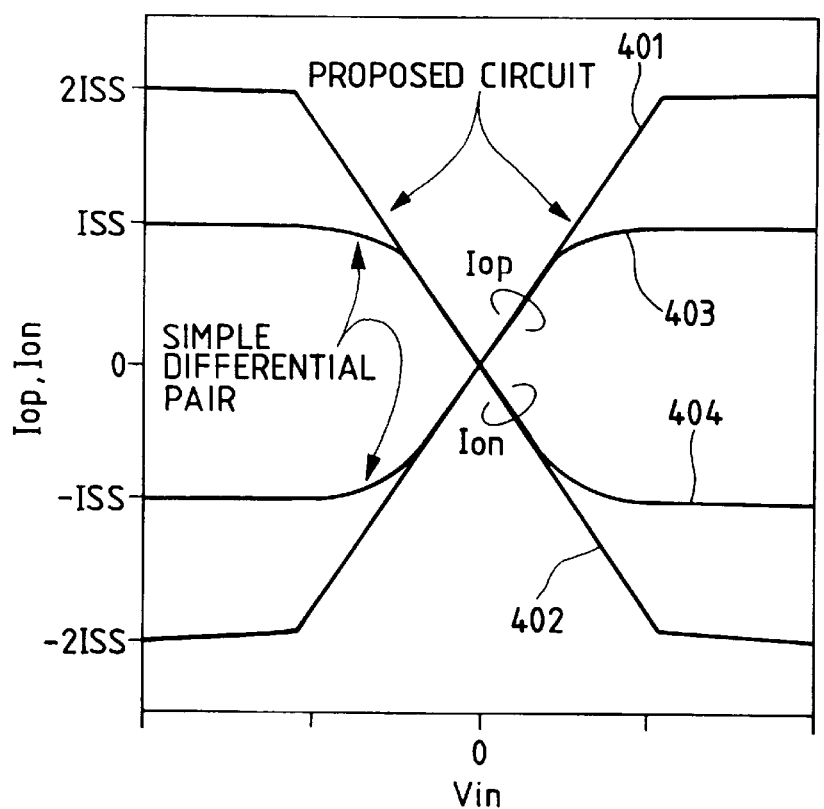
FIG. 4 is a graph showing transfer characteristics of output currents of the circuit of the present invention shown in FIG. 1 and the conventional differential circuit shown in FIG. 2.

In FIG. 4, reference numerals 401 ($I_{op}$) and 402 ($I_{on}$) indicate circuit-simulated transfer characteristics of output currents $I_{op}$ and $I_{on}$ given by Equations 39 and 40. Also, in FIG. 5, reference numerals 501 and 502 indicate transconductance Gm given by Equation 41.

Figure 5:
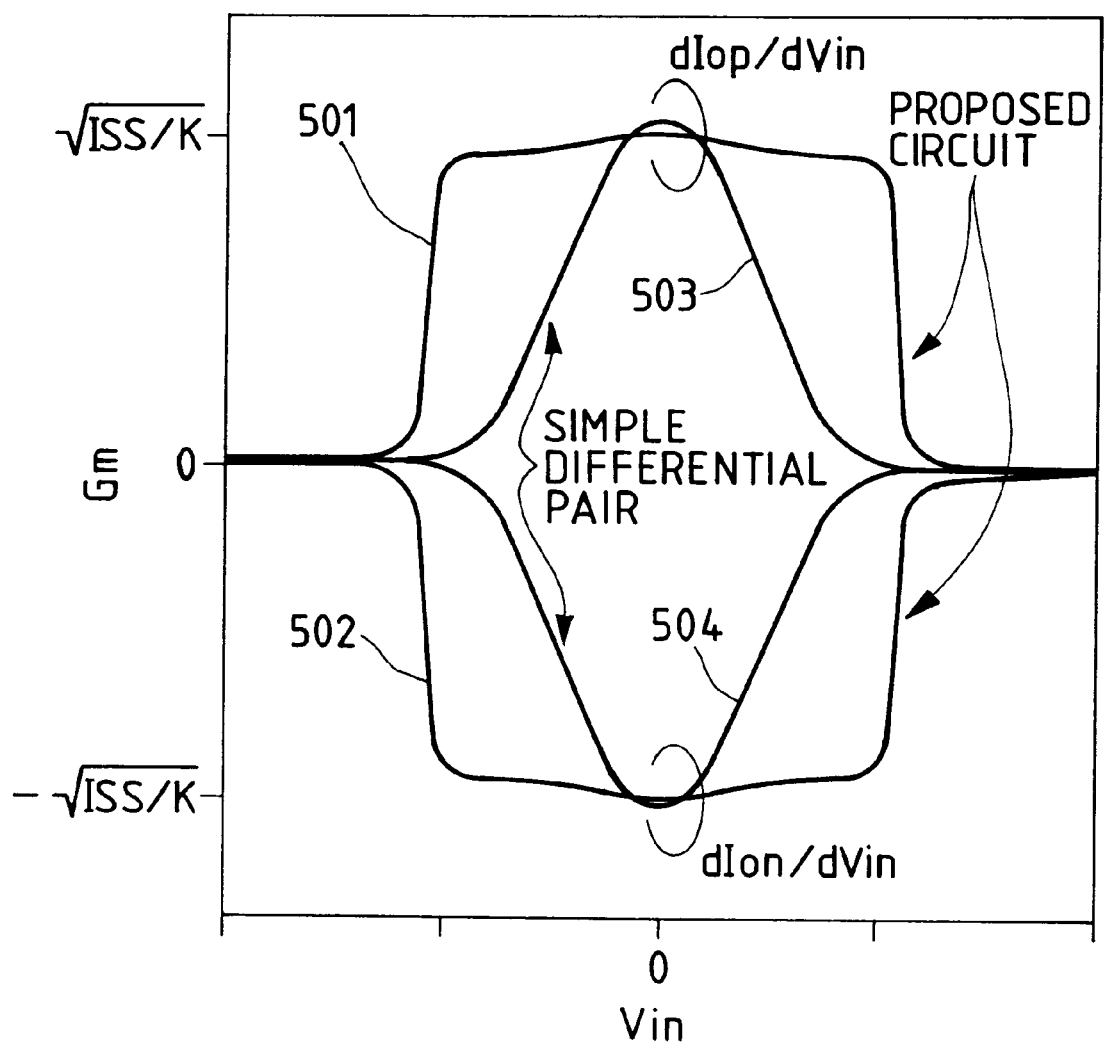
FIG. 5 is a graph showing transconductance characteristics of the circuit of the present invention shown in FIG. 1 and the conventional differential circuit shown in FIG. 2.

As can be seen from FIGS. 4 and 5, a magnitude of differential input voltage $V_{in}$ is large, and a linear transfer characteristic is attained up to the vicinity of a point where an absolute value of output currents $I_{op}$ and $I_{on}$ is $2I_{SS}$. Thus, it is possible to expand the input dynamic range where a linear transfer characteristic can be attained while transconductance Gm has a large value.

According to the present invention, there is provided an electronic circuit including a differential circuit which has a relatively simple structure capable of expanding an input dynamic range where a linear transfer characteristic is attainable.

Having described the present invention as related to the preferred embodiment shown in the accompanying drawings, it is to be understood that various changes and modifications may be made in the invention without departing from the spirit and scope thereof. For example, the MOSFETs in the differential circuit 101 and control circuit 102 may be replaced with silicon-based junction-type FETs or compound-semiconductor MESFETs.

Still more, it is obvious to those skilled in the art that the present invention is not limited in its application to a differential circuit in a conductance amplifier (Gm amplifier) for performing voltage-current conversion in a filter circuit which is incorporated in a hard disk read channel LSI device, mobile communication RF-band signal processing LSI device, etc., and that the invention is applicable to an electronic circuit including a general-purpose differential circuit for expanding an input dynamic range where a linear transfer characteristic can be attained.

What is claimed is:

1. An electronic circuit including a differential circuit comprising first and second field-effect transistors having a differential input voltage applied to each gate thereof and a common source connection therewith, said differential circuit comprising:

third and fourth field-effect transistors which have a common source connection with each source of said first and second field-effect transistors, a drain of said first field-effect transistor and a drain of said third field-effect transistor which are connected with one differential output, and a drain of said second field-effect transistor and a drain of said fourth field-effect transistor which are connected with the other differential output;

said electronic circuit further comprising a control circuit having an output node for generating a control voltage which decreases in response to an increase in magnitude of said differential input voltage applied to each gate of said first and second field-effect transistors, and wherein said control voltage generated from said output node of said control circuit is supplied to each gate of said third and fourth field-effect transistors of said differential circuit.

2. An electronic circuit according to claim 1, wherein said control circuit further comprising:

fifth and sixth field-effect transistors which have said differential input voltage applied to each gate thereof, a common source connection therewith, and a common drain connection with said output node, seventh and eighth field-effect transistors which have a common source connection with each source of said fifth and sixth field-effect transistors, a common gate connection with said output node, and a common drain connection with said output node, ninth field-effect transistor which has a common source connection with each source of said fifth and sixth field-effect transistors and each source of said seventh and eighth field-effect transistors and has a DC voltage of said differential input voltage applied to a gate thereof, and a current mirror circuit which has an input connection with a drain of said ninth field-effect transistor and a common output connection with said output node.

3. An electronic circuit according to claim 2, wherein a first constant-current power supply is connected with each source of said first and second field-effect transistors and each source of third and fourth field-effect transistors of said differential circuit, a second constant-current power supply is connected with each source of said fifth and sixth field-effect transistors and each source of seventh and eighth field-effect transistors of said control circuit, and said second constant-current power supply is set to provide approximately 5/4 of a constant current fed from said first constant-current power supply.

* * * * *